United States Patent
Yamagata

[11] Patent Number: 5,535,158
[45] Date of Patent: Jul. 9, 1996

[54] NON-VOLATILE SEMICONDUCTOR MEMORY DEVICE AND METHOD FOR ERASURE AND PRODUCTION THEREOF

[75] Inventor: Yasushi Yamagata, Tokyo, Japan

[73] Assignee: NEC Corporation, Japan

[21] Appl. No.: 350,978

[22] Filed: Nov. 29, 1994

[30] Foreign Application Priority Data

Dec. 1, 1993 [JP] Japan .................. 5-325787

[51] Int. Cl.$^6$ .................................. G11C 7/00
[52] U.S. Cl. .................. 365/185.29; 365/185.28; 365/185.33
[58] Field of Search .................. 365/185, 218, 365/900; 257/345, 317, 316, 315

[56] References Cited

U.S. PATENT DOCUMENTS

| | | | |
|---|---|---|---|
| 4,281,397 | 7/1981 | Neal et al. | 365/238.3 |
| 4,376,947 | 3/1983 | Chiu et al. | 365/185 |
| 4,729,001 | 3/1988 | Haskell | 257/345 |
| 5,349,553 | 9/1994 | Yamada et al. | 365/185 |
| 5,394,359 | 2/1995 | Kowalski | 365/185 |
| 5,455,790 | 10/1995 | Hart et al. | 365/185.11 |

FOREIGN PATENT DOCUMENTS

| | | |
|---|---|---|
| 0187278A3 | 7/1986 | European Pat. Off. . |
| 0446893A1 | 9/1991 | European Pat. Off. . |
| 0558404A2 | 9/1993 | European Pat. Off. . |
| 2464536A | 6/1981 | France . |
| 52-79884 | 7/1977 | Japan . |
| 56-129374 | 10/1981 | Japan . |
| 60-134477 | 7/1985 | Japan . |
| 61-127179 | 6/1986 | Japan . |
| 62-149218 | 7/1987 | Japan . |
| 6446297 | 2/1989 | Japan . |

OTHER PUBLICATIONS

Verma et al.; "Reliability Performance of Etox Based flash Memories"; 1988 IEEE/IRPS, pp. 158–166.
Kynett, et al.; "An In–System Reprogrammable 32K × 8 CMOS Flash Memory"; IEEE Journal of Solid State Circuits; vol. 23, No. 5, Oct. 1988; pp. 1157–1163.
Yamada et al.; "A Self–Convergence Erasing Scheme for a Simple Stacked Gate Flash EEPROM"; IEDM '91, pp. 307–309.

*Primary Examiner*—David C. Nelms
*Assistant Examiner*—Vu A. Le
*Attorney, Agent, or Firm*—Whitham, Curtis, Whitham & McGinn

[57] ABSTRACT

A non-volatile memory cell disclosed herein includes a pair of regions are provided in a channel region in contact respectively with source and drain to provide a symmetrical structure. A data erase is done by applying a high voltage to the source to produce avalanche breakdown between the source and the region to inject induced hot carriers into the floating gate and wherein the memory cell threshold voltage after erasure is converged to a constant value irrespective of the initial states, while the converged value may be controlled to a desired voltage by applying a suitable voltage to the control gate. Erasure sequence consisting in all bit erase and one verification is sufficient such that the erase sequence is simplified and erase time shortened.

7 Claims, 15 Drawing Sheets

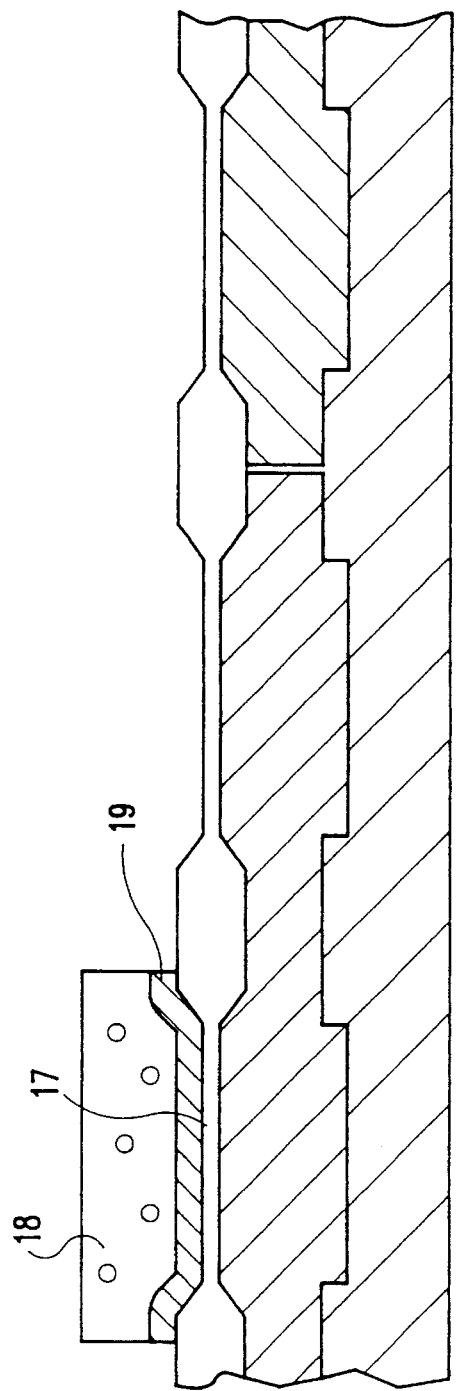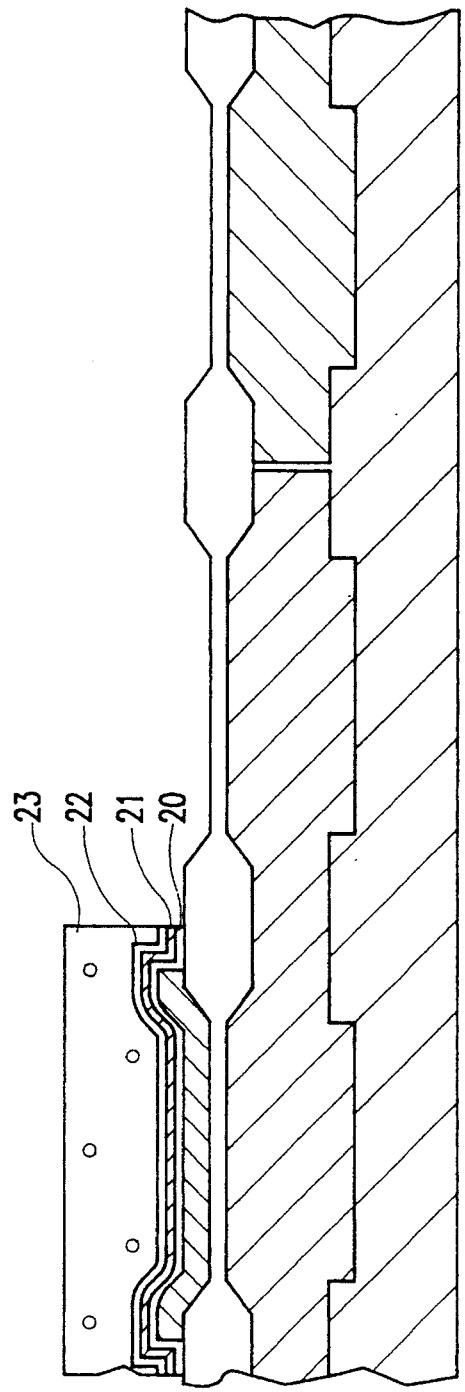

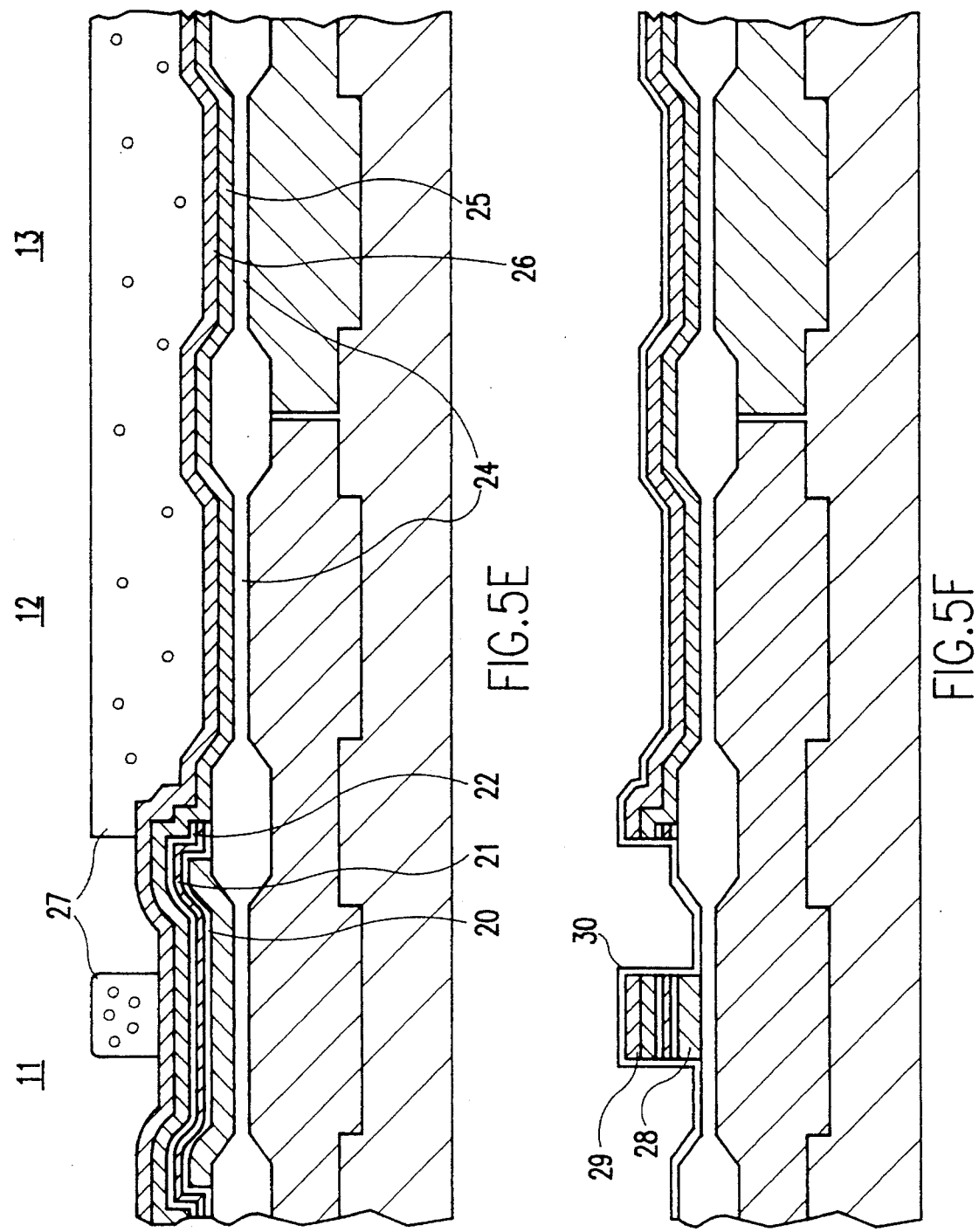

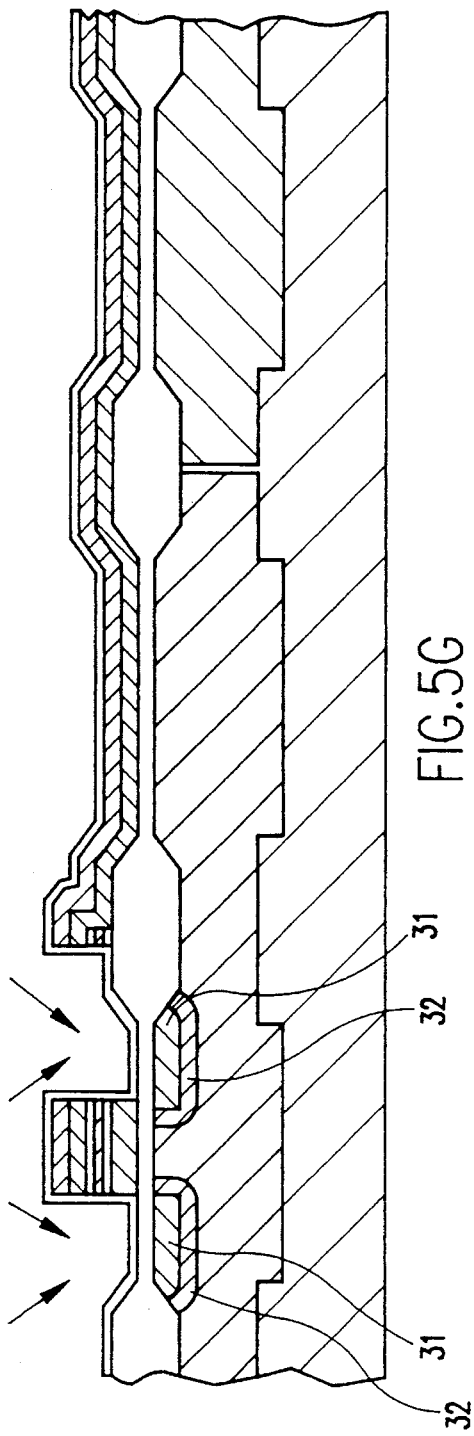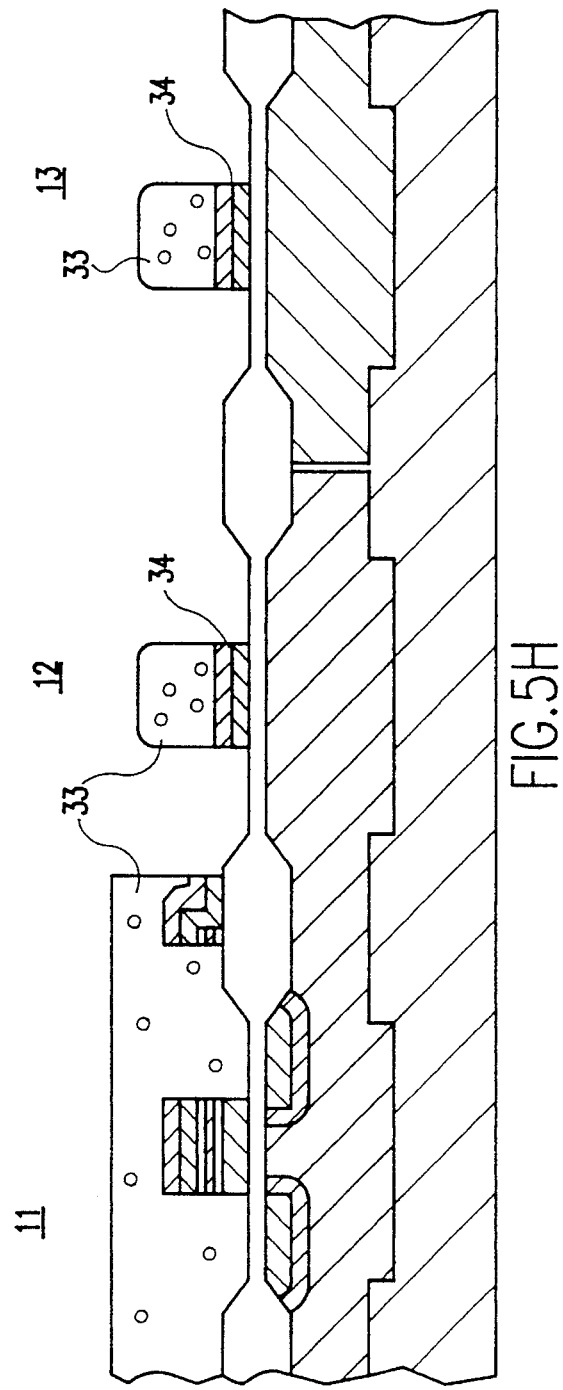

NON-VOLATILE SEMICONDUCTOR MEMORY DEVICE AND METHOD FOR ERASURE AND PRODUCTION THEREOF

FIELD OF THE INVENTION

This invention relates to a non-volatile semiconductor memory device and, more particularly, to a flash EEPROM in which data stored in a plurality of memory cells can be electrically erased simultaneously.

BACKGROUND

As typical prior-art examples of a flash EEPROM (Electrically Erasable and Electrically Programmable Read Only Memory), a unit memory cell structure is shown in FIG. 3b of the JP Patent Kokai publication Sho 61-127179 (1986), while the operation of the unit memory cell is described in, for example, in Gautum Verma & Neal Mielke, "RELIABILITY PERFORMANCES OF ETOX BASED FLASH MEMORIES", 1988 IEEE/IRPS, pages 158 to 166.

The method for programming and erasing data in a memory array comprised of memory cells is shown for example in VIRGIL NILES KYNETT et al, "An In-System Reprogrammable 32K×8 (CMOS Flash Memory", Journal of Solid State Circuit October, 1988 Vol. 1, 23 No. 5 pages 1157 to 1163. These prior-art technique are now described by referring to FIGS. 7 and 8A–8B.

FIG. 7 shows a unit memory cell in cross-section. The memory cell is made up of a drain diffusion layer 502 formed by a n$^+$ diffusion layer on the surface of a p-type semiconductor substrate 501, a source diffusion layer 503 having a double structure of an n$^+$ diffusion layer 503-1 wrapped by an n$^-$ diffusion layer, 503-2, a floating gate 505 provided on a tunnel insulating layer 504 covering a channel region between the source and the drain, and a control gate 507 provided thereover with intervention of an insulating layer 506.

Referring to FIGS. 8A and 8B, operation of the memory cell is explained. For writing or programming data, the source and the substrate are grounded and high voltages Vg and V$_D$ (Vg>V$_D$) are respectively applied to the control gate and the drain to inject electrons generated by impact ionization near the drain into the floating gate, as shown in FIG. 8A.

For erasing the data, the control gate and the substrate are grounded and the drain is kept open. On the other hand, a (positive) high voltage V$_{pp}$ is applied to the source, as shown in FIG. 8B. As a result, electrons can be transported from the floating gate to the source due to tunneling effect. The n$^-$ diffusion layer 503-2 is provided in the source in order to prevent avalanche breakdown from being generated between the source and the substrate even if a voltage sufficient to produce tunnel emission is applied to the source.

In an actual memory device, a number of such memory cells are arranged in a matrix to provide a memory cell array, as shown in FIG. 9. In this memory device, the control gates of the memory cells of the same rows are connected in common to an associated one of a plurality of word lines 508, the drains of the memory cells of the same columns are connected in common to an associated one of a plurality of bit lines 509, and the sources of the memory cells of the same columns are connected in common to an associated one of a plurality of source lines 510. The word lines 508 and the bit lines 509 are connected to a row decoder 511 and a column decoder 512, respectively. The source lines 510 are connected in common to a circuit mode, supplied via a selector switch 513 with the ground during read out and writing of the memory cell and with an erase voltage from a generator 514 during erasure of the memory cells.

The memory cell array also includes a read control circuit 515, and a write control circuit 516 and a erase control circuit 517 for performing data reading, data writing and erasing operations. Output control signals of the read out control circuit 515, the write control circuit 516 and the erase control circuit 517 are supplied to the row decoder 511 and the column decoder 512.

The operation of the memory cell array shown in FIG. 9 is now explained. During writing in the memory cell, the source lines 510 are connected to the ground via the selector switch 513 and a write control circuit 516 operates to write data in the memory cell MC selected by setting a selected bit line and a selected word line to a high level voltage by the column decoder 512 and the low decoder 511, respectively.

During read out, as during writing, the source lines 510 are connected to the ground and the read out control circuit 515 operates for setting a selected bit line and a selected word line to a read-out voltage (~5 V) by the column decoder 512 and the row decoder 511 to read out the selected memory cell.

During erasure of the memory cell, the source lines 510 are connected via the selector switch 513 to the erase voltage generator 514 and the erase control circuit 517 is activated for setting the source lines 510 and the word lines to a high voltage (~12 V) and to the ground potential, respectively, for erasing all the memory cells in their entirety.

With the conventional flash EEPROM, all the bits are written before erasing for setting the threshold voltage of all the memory cells substantially to the same value. In order to prevent the occurrence of overerasure of the memory cells, the erasure is then carried out in the short interval, little by little by dividing the erase time into small fractions of short internal. The threshold voltage of the memory cells are verified after each erase step and the erase operation is stopped when an optimum threshold voltage is reached.

The reason such erase procedure is adopted is that overerasure leads to infeasibility of correct data read out. Memory cell erasure is explained hereinbelow by referring to FIGS. 10 and 11.

FIG. 10 is a graph showing the relation between the memory cell threshold voltage V$_{TM}$ and the erase time. As may be seen from the graph of FIG. 10, should the erase time to exceed a certain value t$_o$, the memory cell threshold voltage, set in the initial state to a value on the order of the threshold voltage of 5 V, assumes a negative value. That is, the memory cell is in a state of so-called depletion status in which it is turned on even when a gate is of a ground potential.

It is now supposed that, with the memory cell array shown in FIG. 9, a memory cell array H is overerased. If then data is written into a memory cell I and subsequently read out, no current will flow between the drain and the source of the selected memory cell I. However, the current flows between the drain and the source of the non-selected memory cell H, so that the current flows through the leftmost bit line. For this reason, the off-bit memory cell I would be erroneously detected as being on-bit. Thus there should be no overerasure during memory cell erasure.

Referring to FIG. 11, the reason the writing of all bits prior to erasure is required is now explained.

FIG. 11 is a graph showing erasure characteristics of a memory cell in a written state and a memory cell in the non-written state. In a flash EEPROM memory cell array, a fraction of the memory cells are usually in the written state, while the remaining memory cells are in the non-written state. Since the erasure speed of the written memory cell is substantially equal to that of the non-written memory cell, an overerasure is produced in the non-written memory cell (see the lower line in FIG. 11) of the written memory cell is insufficiently erased, unless all the bits ape set to the written state before erasure of all of the bits.

The above-described prior art flash EEPROM has the following disadvantages.

First, the source and drain have asymmetrical structures, such that one mope mask needs to be used, thus raising production cost.

Second, a higher voltage (~12 V) is required for driving the memory cell.

The recently employed high performance fine-sized CMOS transistors, such as those having a gate length of 0.8 μm or less and a transconductance value of 400 or above cannot maintain the breakdown voltage as required. Thus, in order to cope with high voltages, high breakdown voltage transistors having a dedicated gate insulating layer or source/drain structure need to be employed, so that the number of masks used fop producing such components is increased.

Specifically, in the case of an oxide layer, an electric field applied to the gate insulating layer is set to less than or equal to a maximum of 4 MV/cm, above which a tunneling current starts to flow. For example, the thickness of the oxide layer is set to a value on the order of 300 Angstrom (30 nm) if a memory cell is to be driven at a voltage of 12 V. For an voltage of 5 V, the thickness of the oxide layer is set to a value on the order of 130 Angstrom (13 nm). For a source drain structure of the high breakdown voltage transistor, a lower impurity concentration is employed than for the ordinary source drain structure.

That is, if a conventional flash EEPROM is to be formed on an integrated circuit made up of high-performance fine-sized CMOS transistors, a higher voltage is required for driving the memory cell. For this reason, in the case of the high-performance fine-sized integrated circuit, it is necessary to provide dedicated high breakdown voltage transistors, while an increased number of the masks need to be employed for producing them, with consequent rise in the production cost.

Third, for preventing an overerasure during erasing, data is written in all the bits before erasure. Besides, for maintaining the threshold voltage of a memory cell to be erased at a proper level, the memory cell threshold voltage needs to be verified each time the erasure is executed for a pre-set short interval of time, as a result of which the erase procedure becomes complex and the chip area is increased due to the increased number of control circuits while the time required for erasure testing is increased with a consequent rise in the production cost.

For obviating the above-mentioned second drawback, there is disclosed in JP Patent Kokai Hei 3-79884 (1991) and JP Patent Kokai Sho 56-129374 (1981) means for lowering the memory cell operating Voltage. Such voltage lowering means is now explained by referring to FIG. 12.

In FIG. 16, there is known a method for erasure comprising generating the avalanche breakdown state between a semiconductor substrate 501 and a drain diffusion layer 502 and applying a negative voltage to a control gate 507 for injecting holes into a floating gate 505. A $p^+$ region 518 higher in concentration than the substrate 501 is provided in the vicinity of the drain 502 for producing avalanche breakdown at lower voltage in order to effect erasure.

However, with the above method in which the $p^+$ region 518 higher in concentration than the substrate 501 is provided in the vicinity of the drain 502 and a lower voltage is applied to the drain to produce avalanche breakdown between the drain and the substrate, while the negative voltage is applied to the control gate 507 to inject holes into the floating gate, the number of peripheral control/circuits is increased for applying both the positive and negative voltages, while the circuit area is increased with a rise in the production cost. In addition, since the $p^+$ region 518 is selectively formed only neap the drain 502, the number of the masks is similarly increased due to the asymmetric structure.

For obviating the above-mentioned third drawback in the conventional flash EEPROM, there are proposed in JP Patent Kokai Sho 64-46297(1989) a method and an apparatus for self limiting electrical erasure of a single-transistor-floating-gate cell. With such structure, drain potential is fed back during erasure via a feedback amplifier to a control gate, and an erase voltage is applied to a source, with electrons penetrating from the floating gate to the source under tunneling effect, wherein the drain potential is raised proportionately as electrons are discharged from the floating gate. Such rise in potential is detected to stop the erasure.

As another means for obviating the above-mentioned third drawback, the source, the control gate and the substrate are grounded, and a voltage just high enough to turn the channel on is applied to the drain, so that holes or electrons generated by impact ionization neap the drain are injected into the floating gate, as disclosed in YAMADA et al "A Self-Converence Erasing Scheme for a Simple Stacked Gate Flash EEPROM", IEDM '91, pages 307 to 309. With such method, even if overerasure occurs in a memory cell, rewriting is made to make the overerased memory cell to an enhancement state, i.e., to return to a positive threshold voltage state, while threshold voltages of plural transistors in the erased state are made uniform. Representative data of threshold voltage variation with respect to the re-write mechanism and the stress time by this method are shown in FIG. 13.

FIG. 17 shows the threshold voltage versus the drain stress time, with different initial threshold voltages as parameters. The control gate and the source are grounded and 6 V is applied to the drain. In FIG. 13, there is no shift to a stable state with an initial threshold voltage $V_{TM}$ of 3 V, but the lower two threshold voltages with the source grounded (with initial threshold voltages $V_{TM}$ of 1 V and −1 V) are shifted to reach a stable state. YAMADA et al state that this would be ascribable to the channel electron induced avalanche hot carrier(CEIA-HC) injection.

JP Patent Kokai Sho 64-46297 (1989) discloses stopping the erase process by detecting rise in the drain voltage for preventing overerasure. However, it is indispensable to write all bits before erasure thus protracting the erasure sequence with rise in the cost in erasure testing so that the chip area is increased by an increased control circuitry and hence the production cost is increased.

With a method shown in IEDM '91 pages 307 to 309, in which overerased cells are returned to a predetermined state by re-writing, writing in all bits before erasure is not required. However, since channel electron induced avalanche hot carrier injection (CEIA-HC injection) is performed after erasure by Fowler-Nordheim (F-N) tunneling injection, a two-steps of erase processes are required and a problem still exists that significant reduction in cost is required for erasure testing. With the technique disclosed in IEDM '91 pages 307 to 309, the verification of the threshold voltage after erasure is carried out in practice.

SUMMARY OF THE INVENTION

It is therefore an object of the present invention to provide a flash EEPROM which employs a smaller number of masks during production compared with the above-described prior art and hence for which the production cost may be reduced.

It is another object of the present invention to provide a flash EEPROM which can be operated at a lower voltage than with the prior-art techniques and which can thus be formed on a IC chips comprising the high-performance fine-sized CMOS transistors, with a smaller number of masks in use compared with the prior-art techniques.

It is still another object of the present invention to provide a flash EEPROM which can be erased by a sequence of operations simpler than with the prior-art technique and hence within a shorter erasure time and in which the testing cost for erasure may be reduced compared with the prior-art technique.

A non-volatile semiconductor memory device according to the present invention is featured by comprising, in addition to a basic structure of a memory cell, first and second a regions of a conductivity type equal to the channel region having an impurity concentration higher than that of the channel region and formed in the channel region in contact respectively with drain and source regions.

BRIEF DESCRIPTION OF THE DRAWINGS

The above and other objects, advantages and features of the present invention will be more apparent from the following description taken in conjunction with the accompanying drawings, in which

FIGS. 5A to 5J are cross-sectional views showing respective steps of a method for producing a non-volatile semiconductor device according to the first embodiment;

DETAILED DESCRIPTION OF THE PREFERRED EMBODIMETS

Figure 1A:
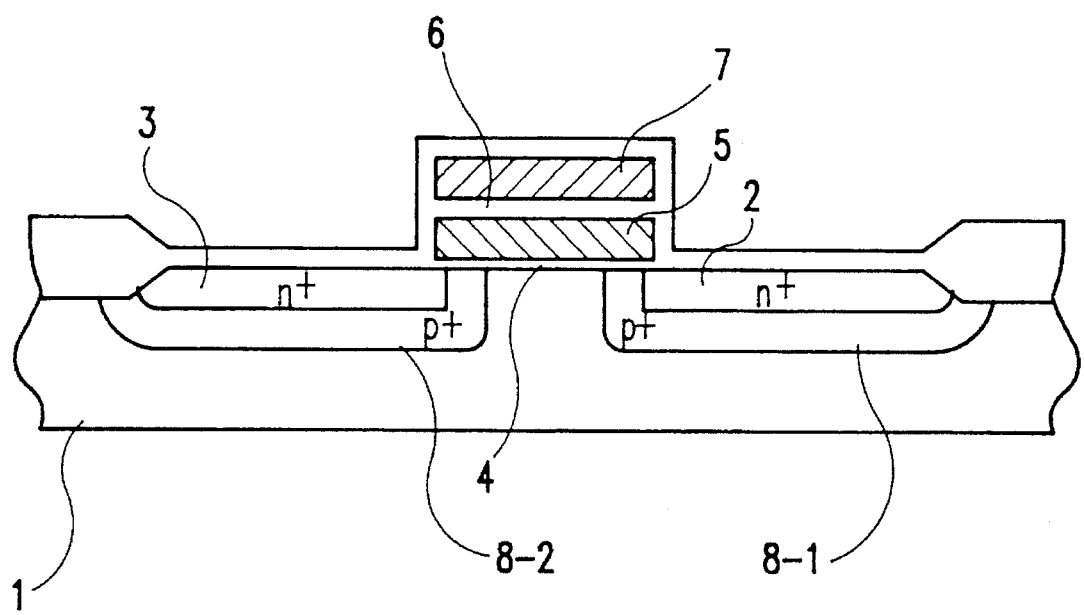
FIG. 1A is a cross-sectional view of a flash EEPROM according to a first embodiment of the present invention.

Referring now to FIG. 1A, a non-volatile memory cell included in a semiconductor memory device according to an embodiment of the present invention includes a drain 2 and a source 3 each formed as an $n^+$ diffusion layer in a p-type semiconductor substrate 1, and a first gate insulating layer 4 made of an oxide layer to cover a channel region of the semiconductor surface 1 between the source 3 and the drain 2 with a thickness of 70 to 200 Angstrom (7 to 20 nm), formed on the gate insulating film 4 is a floating gate 5 on which a second gate insulating film 6 is formed. This insulating layer 6 is formed as a three-layer structure comprising an oxide layer, a nitride and an oxide layer (each not shown). A control gate 7 is formed on the gate insulating film 6. Thie memory cell further includes p-type regions 8-1 and 8-2 which have an impurity concentration higher than the p-type semiconductor substrate 1 and surround or wrap the drain 2 and the source 3 to provide a pair of side ends threof disposed within the channel region.

The impurity concentration of each of the source 3 and drain 2 is on the order of concentration of the $10^{19}$ to $10^{21}$ $cm^{-3}$, while the $p^+$ impurity concentration of the p-type region 8 is on the order of $10^{18}$ to $10^{19}$ $cm^{-3}$.

The source 3 and the drain 2 are of the same structure, that is of a symmetrical structure, so that the dual gate arrangement, source-drain and the p-type region 8 wrapping the source-drain can be formed by one and the same mask process. The symmetrical structure of the source and drain represents a first feature of the present invention.

Figure 9:
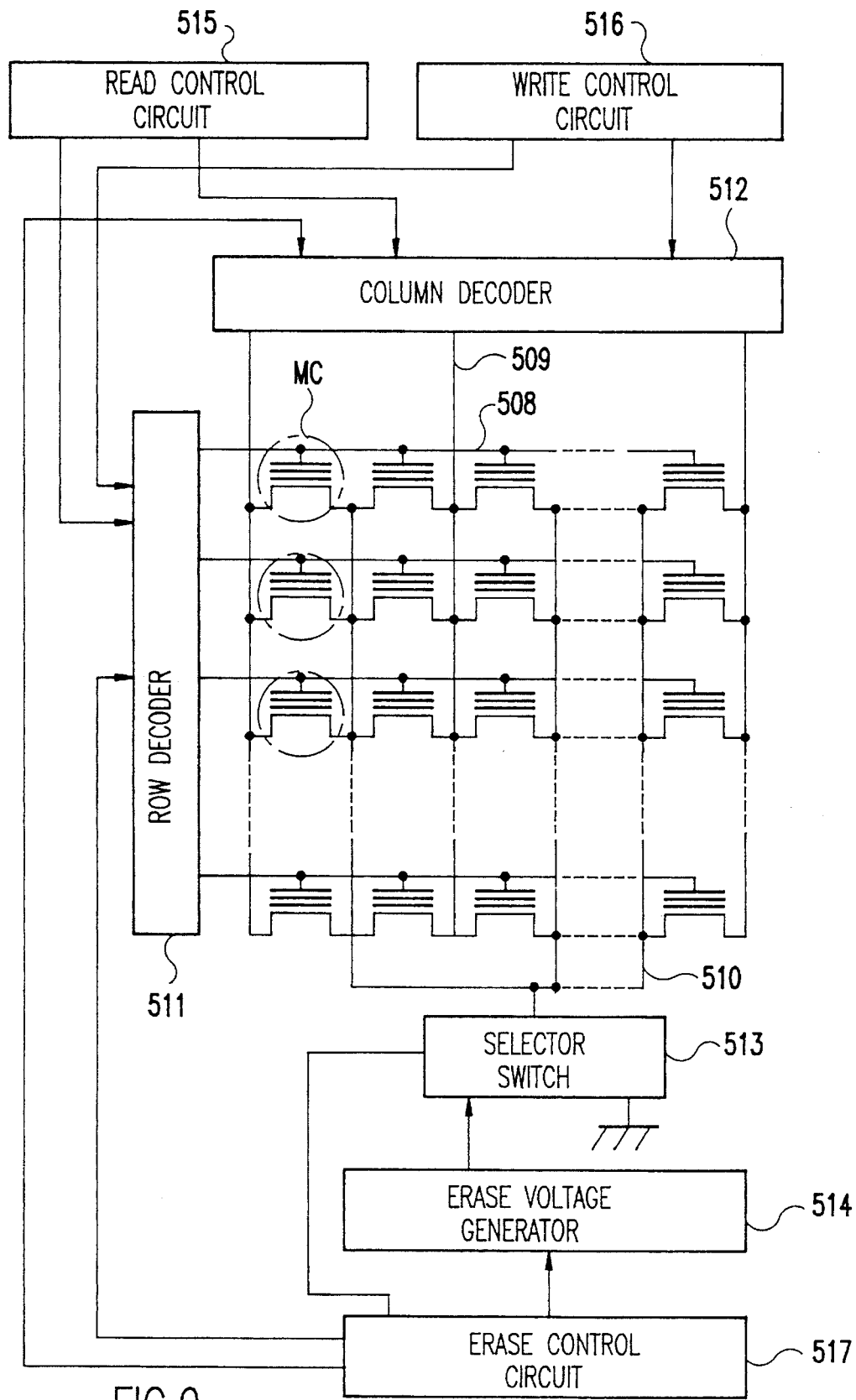
FIG. 9 is a block diagram showing a circuit arrangement of the flash EEPROM cell array.
Figure 10:
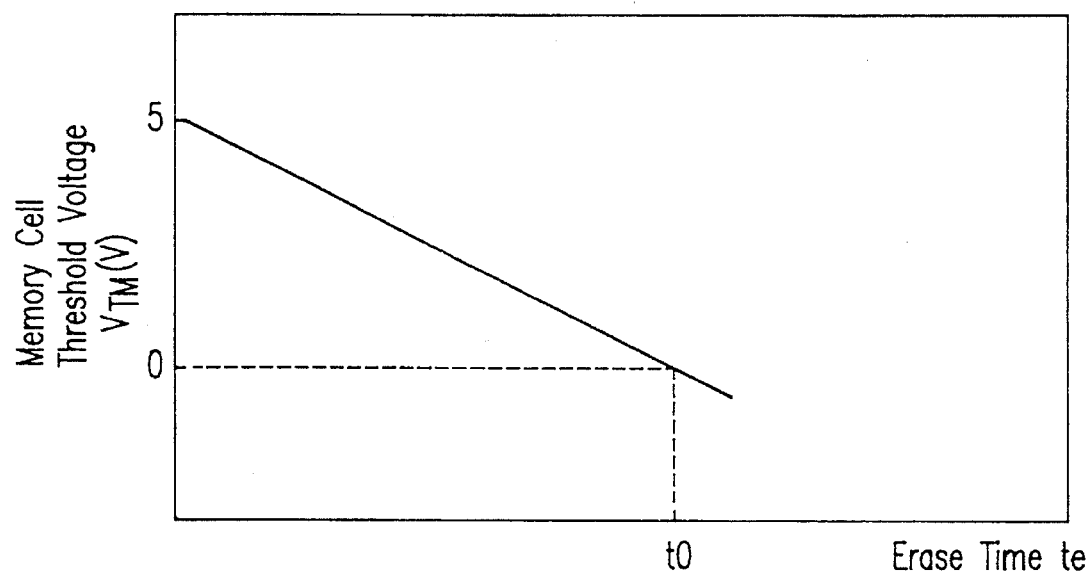
FIG. 10 is an explanatory view showing erasure characteristics for the conventional flash EEPROM cell.
Figure 11:
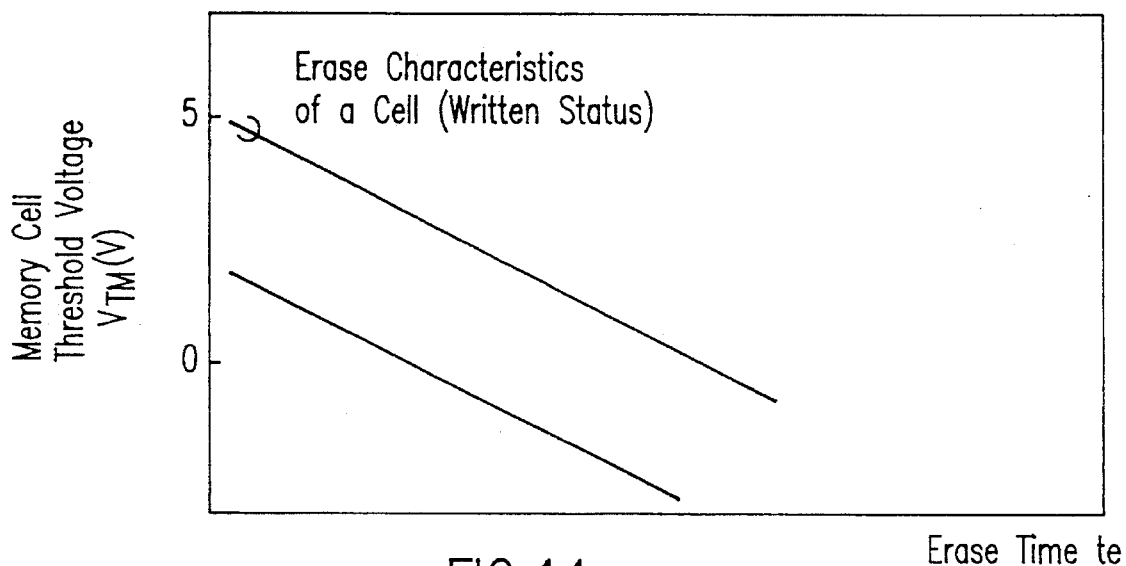
FIG. 11 is an explanatory view showing erasure characteristics for the conventional EEPROM cell.
Figure 12:
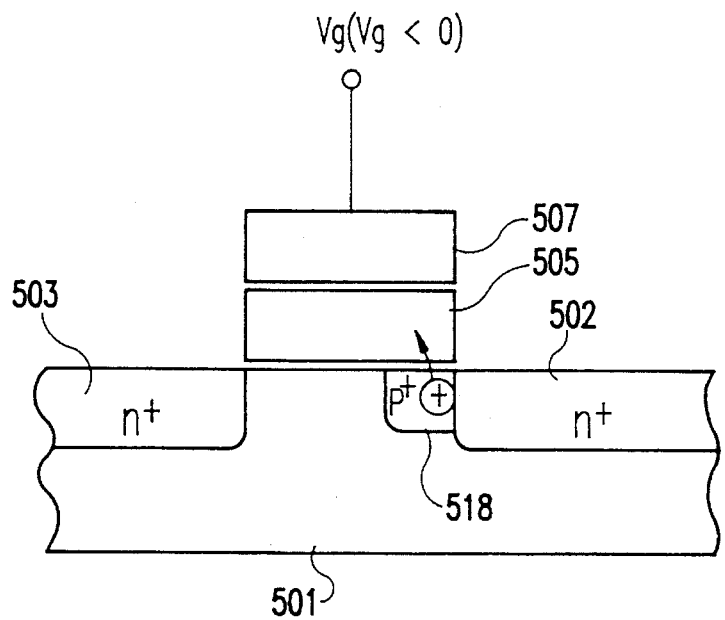
FIG. 12 is a cross-sectional view of another conventional EEPROM cell.
Figure 13:
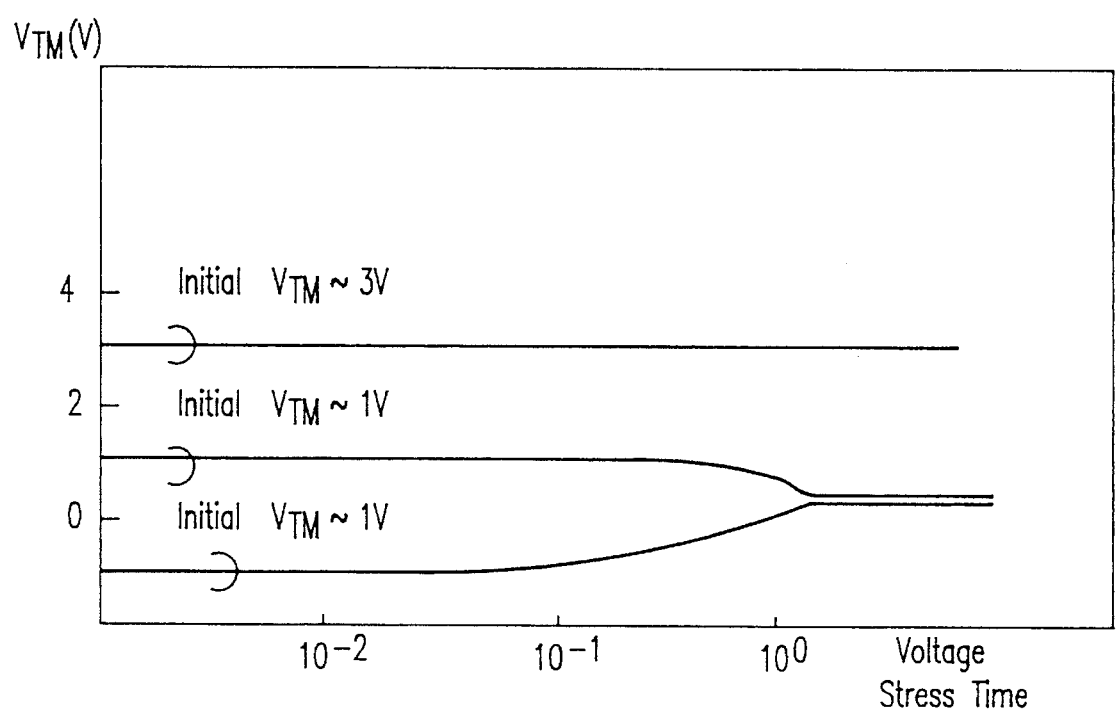
FIG. 13 is an explanatory view showing erasure characteristics of the EEPROM cell by another conventional erasure method.

In the following, the method of writing and erasing data in the non-volatile semiconductor device of the present embodiment will be explained. Note that the block diagram of the memory device of this embodiment is substantially the same as that shown in FIG. 9.

Data writing or programming is carried out by a well-known method of channel hot electron injection. That is, a voltage of 3 to 7 V and a voltage of 6 to 11 V are applied to the drain 2 and the control gate 7, respectively, while the source and the substrate 1 are being grounded, so that electrons generated by impact ionization near the drain region 2 are injected into the floating gate 5.

Figure 1B:
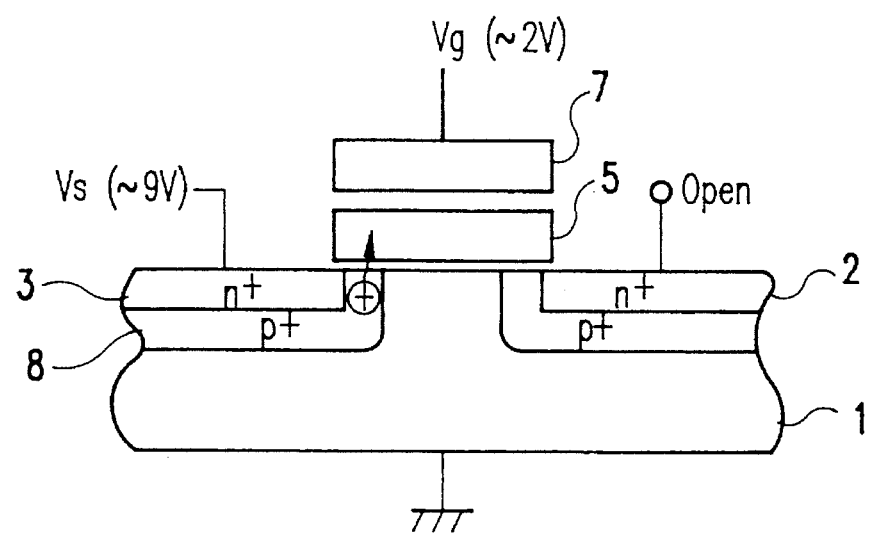
FIG. 1B is an explanatory view of a data erasure operation on the cell shown in FIG. 1A.

For data erasure, as shown in FIG. 1B, the drain 2 is brought into an open state, and the substrate 1 is grounded. A positive voltage of e.g., 2 V is applied to the control gate 7 and a voltage not lower than the avalanche breakdown voltage between the source 3 and the region 8 such as 9 V, is applied to the source 3 to make avalanche breakdown take place between the source and the substrate, resulting in that hot carriers are induced and then injected into floating gate 5. The voltage Vg applied to the control gate 7 has an important role of controlling the threshold voltage of the cell after erasure to a desired value for preventing overerasure, as will be explained subsequently.

The avalanche breakdown voltage may be lowered by raising the concentration of the p-type region 8 wrapping the source 3 and drain 2, respectively. Thus it is possible for the present embodiment to achieve erasure at a lower voltage.

The p-type region 8 enclosing the drain 2 plays the role of improving the writing efficiency.

With the non-volatile semiconductor memory device according to the present embodiment, erasure and writing may be achieved at a lower voltage by suitably setting the concentration of the p-type region 8 wrapping the source and drain.

Figure 2:
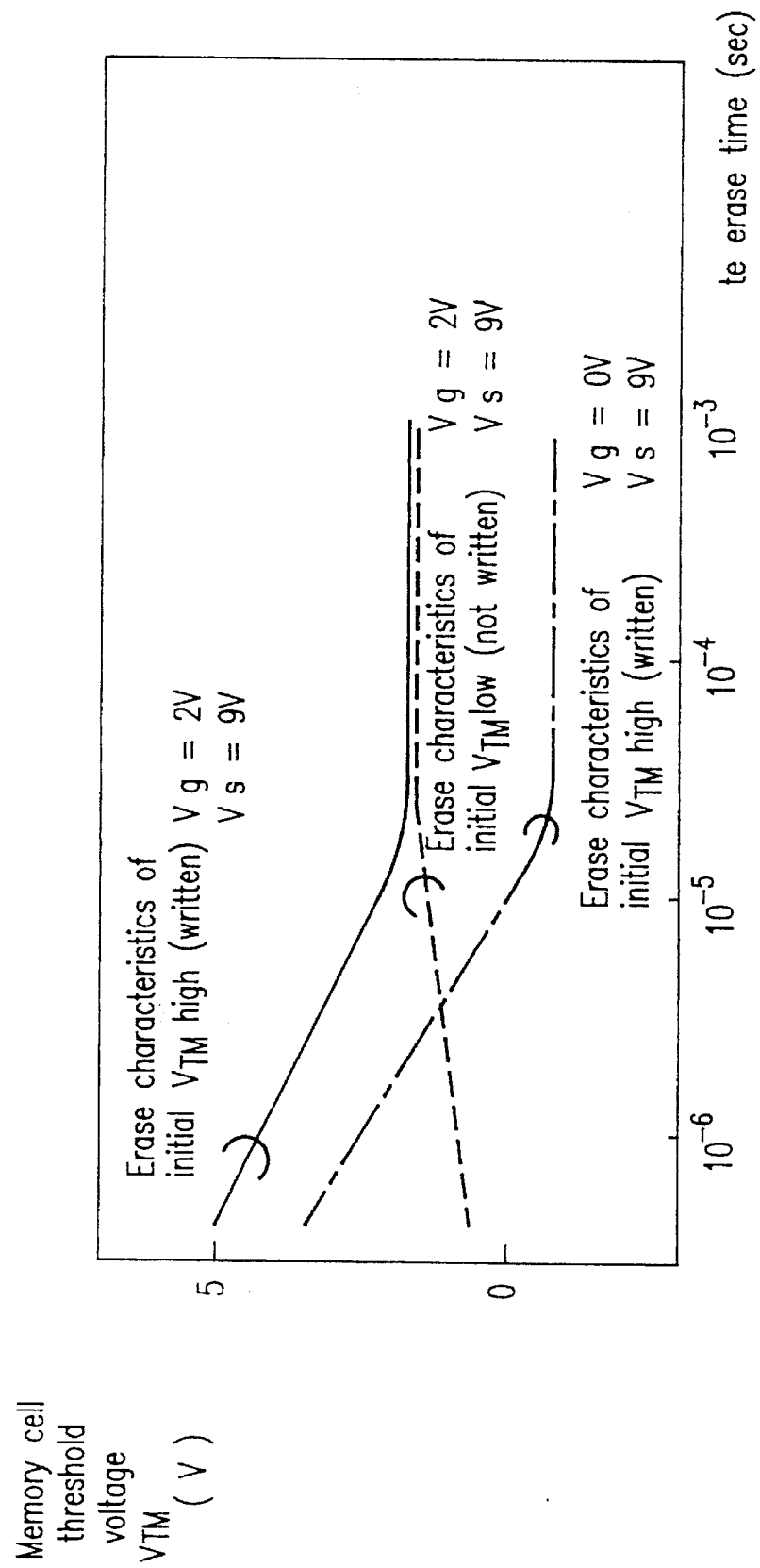
FIG. 2 is an explanatory view of erasure characteristics for the flash EEPROM according to the present invention.

FIG. 2 shows the results of carrying out the erasure method of the present invention in the non-volatile semiconductor memory device according to the present invention. A flash EEPROM device employed for obtaining these results was formed by a production method as discussed later on.

In FIG. 2, a solid line represents the erase characteristic of a written cell having a high value of an initial threshold voltage wherein 9 V is applied to a source and 2 V is applied to a control gate while an alternate long and short dash line represents the erase characteristic of a written cell having a low value of an initial threshold voltage wherein 9 V is applied to a source and 0 V is applied to a control gate. A dashed line represents the erase characteristic of a non-written cell wherein 9 V is applied to a source and 2 V is applied to a control gate. The drain of each cell in FIG. 2 is set to an open circuit state during erasure.

As shown in FIG. 2, the threshold voltage after erasure reaches or converges to the steady state positive voltage if a control gate voltage Vg is being set to 2 V in both cases of a written cell and a non-written cell.

The avalanche hot carrier erasure according to the present invention is not dependent upon the initial threshold voltage, i.e., upon the written or non-written state, and the threshold voltage is self-limited to a constant value after erasure. That is, the threshold voltage is converged after erasure to a constant value.

The reason is that the type of the carrier injected during erasure is set by a difference in electric potential between the floating gate potential and the potential in a depletion layer directly beneath the floating gate near the source, with the injection not occurring at a zero potential difference.

The converged threshold voltage depends on the floating gate potential as set by the applied voltages to each cell terminal. Thus the threshold value after erasure may be controlled to a desired value by carrying out erasure with the control gate voltage Vg being fixed at an optimum value.

With the example of FIG. 2, the threshold voltage after erasure for a control gate voltage Vg=0 V is 0 V or less, that is, the depletion status, and hence the state of overerasure is reached. However, by setting Vg=2 V, the threshold value after erasure is set to approximately 1.5 V, so that the state of overerasure is prevented from occurrence.

Thus, in accordance with the present invention, the all-bit erasure and threshold voltage verification suffice for the erasure sequence. That is, according to the present invention, there is no need to program all the memory cells before erasure hitherto required for setting the initial thershold voltages of all the memory cells uniform, and there is also no need to iterate erase and verify sequences, as a result of which the significant simplification of the erase procedure may be accomplished and the erasure time may be shortened as compared to the prior-art technique. This is the third feature of the present invention.

According to the present invention, the memory cell forming process can be carried out using a smaller number of masks. In addition, if the non-volatile semiconductor memory device of the present invention is combined with an integrated circuit made up of high-performance CMOS transistors having a submicron-sized gate length and a thin gate insulating layer, production can be achieved using a significantly smaller number of masks, compared with the prior-art technique. In the following it will be explained.

A high voltage $V_{pp}$ is usually required for writing and erasing data in flash EEPROMs. The typical value for high voltage $V_{pp}$ is on the order of 12 V. However, the voltage that can be used for driving the high-performance CMOS transistors, such as those having a gate length of 0.8 μm or less is on the order is 5.5 V at the maximum. Consequently, for combining the high-performance CMOS transistors with the flash EEPROM, it is necessary to provide a dedicated transistor having a source-drain structure and a gate insulating layer for driving $V_{pp}$, as a result of which the number of masks employed for production is increased.

However, by lowering a driving voltage of the memory cell according to the present invention in combination with a circuit technique of enabling prevention of a voltage in excess of ½ $V_{pp}$ from being applied to the gate insulating layer during driving at the high voltage $V_{pp}$, as typified by means disclosed in JP Patent Kokai JP-A-62-149218 (1987), there is no need for providing the dedicated transistor for driving at the high voltage $V_{pp}$, thus making it possible to reduce the number of the masks significantly.

FIGS. 3 and 4 show, in an operational conceptual view, a voltage dividing inverter operated at a higher voltage without employing the high voltage driving transistor.

Figure 3A:
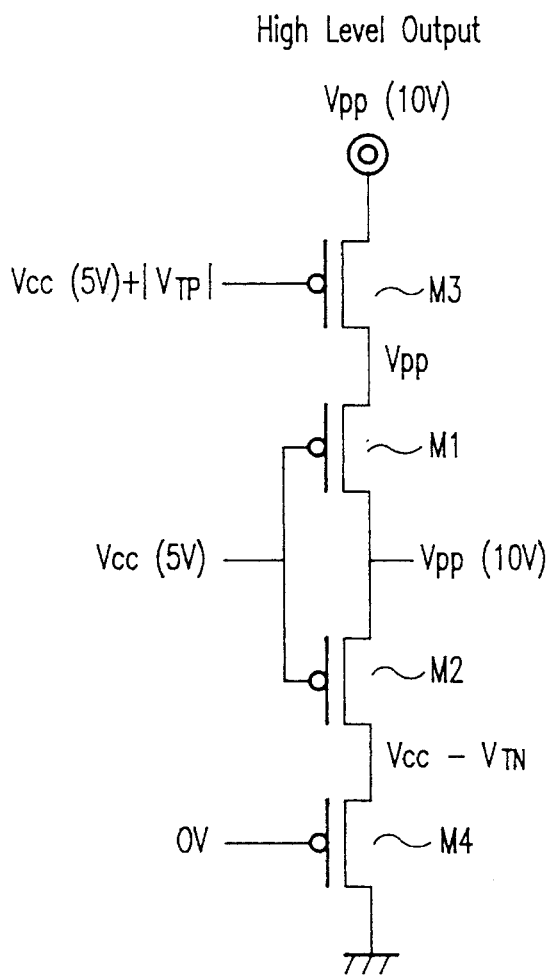
FIG. 3A and 3B are circuit diagram showing voltage dividing inverters.
Figure 3B:
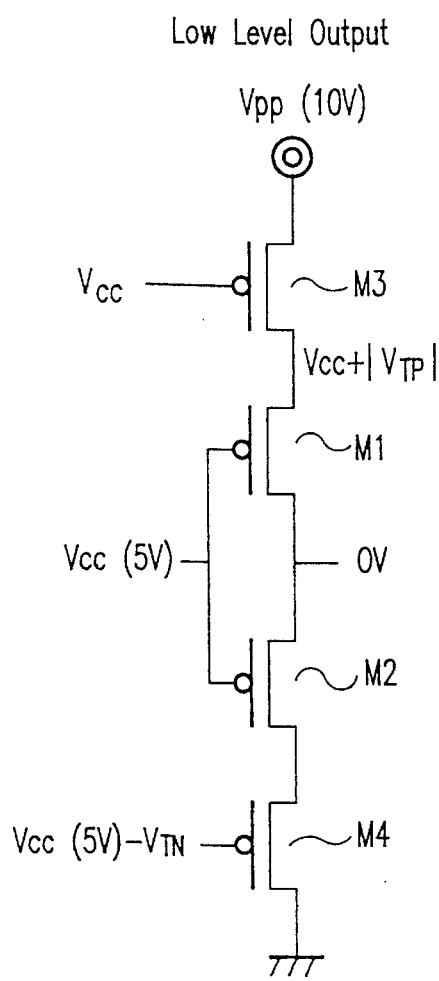

Referring to FIG. 3, with a threshold voltage of the p-type MOS transistor of $V_{TP}$ and a threshold voltage of the n-type MOS transistor of $V_{TN}$, a potential of $V_{cc}(5\ V)+|V_{TP}|$ is applied to a gate of a p-type MOS transistor $M_3$ and only a potential $V_{cc}-V_{TN}$ is applied to a junction between n-type MOS transistors $M_2$ and $M_4$ at the time of outputting a High level $V_{pp}$, as shown in FIG. 3A. On the other hand, a potential of $V_{cc}(5\ V)-V_{TN}$ is applied to a gate of the n-type transistor $M_4$ and only a potential of $V_{cc}+|V_{TP}|$ is applied to a junction between n-type MOS transistors $M_1$ and $M_3$ at the time of outputting a Low level, as shown in FIG. 3B. Consequently, since $V_{cc}$ is applied to gates of the MOS transistors $M_1$ and $M_2$ even if a voltage up to an output $V_{pp}(10\ V)$ is applied, the drain breakdown voltage is increased and hence the operation at a higher voltage becomes possible without employing high breakdown voltage transistors.

Figure 4A:
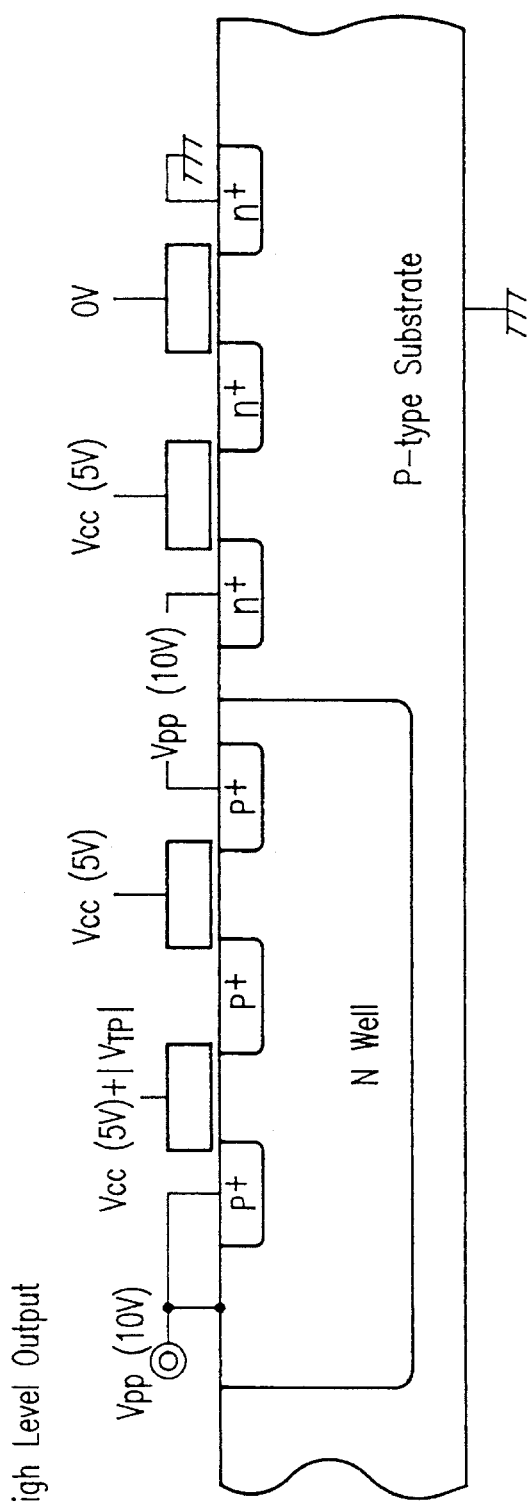
FIG. 4A and 4B are cross-sectional views showing the voltage dividing inverters shown in FIGS. 3A and 3B.
Figure 4B:
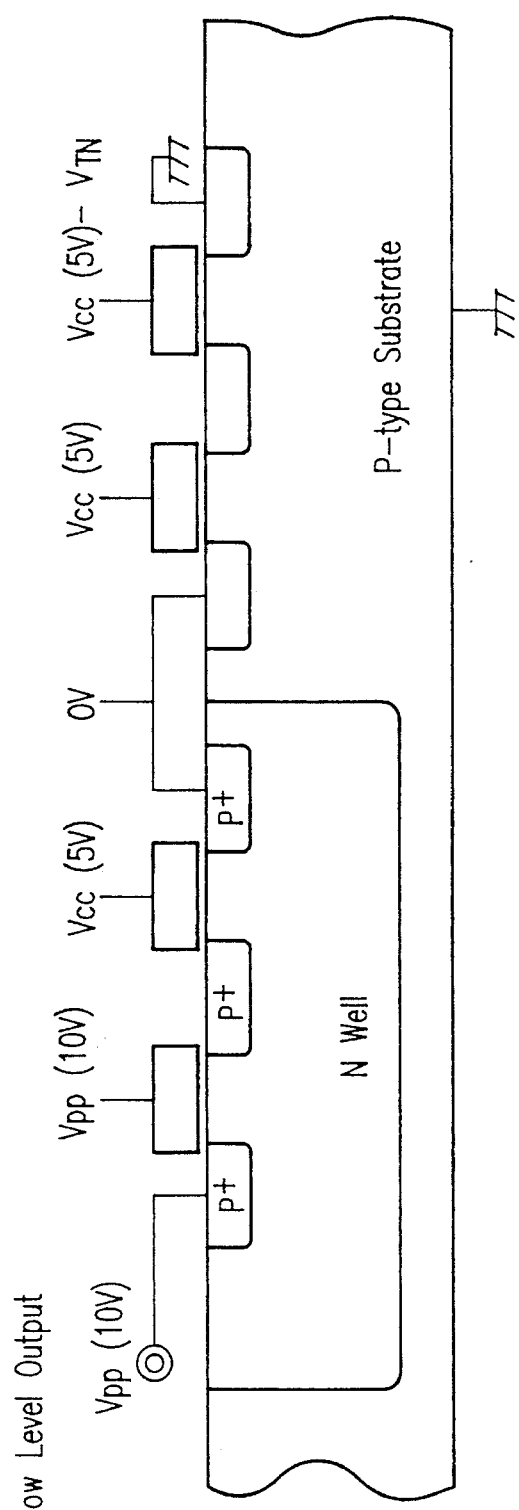

FIGS. 4A and 4B show the potential at each terminal in cross-sectional views of the voltage-dividing inverters shown in FIGS. 3A and 3B, respectively.

By such circuit technique, driving becomes possible up to a voltage (10 V in the Figures) twice the driving voltage (5 V in the Figures) of the high-performance CMOS transistor.

With the memory cell of the present invention, the voltage may be lowered to about $V_{pp}$~9 V and hence there is no need to provide a dedicated $V_{pp}$ driving transistor, as a result of which the flash EEPROM and the high-performance CMOS transistors may be combined to form an IC without increasing the number of the masks in use.

There is also a method in which a gate insulating layer of transistors constituting a circuit adapted for preventing a voltage in excess of ½ $V_{pp}$ from being applied to a gate insulating layer is formed by the same process as that for forming an insulating layer between the floating gates and the control gates of the flash EEPROM. This insulating layer is usually of a three-layer structure comprised of an oxide layer, a nitride layer and an oxide layer and has an effective layer thickness larger than that of the gate insulating layer employed in the high-performance CMOS transistor.

Consequently, even if the gate insulating layer of the high-performance CMOS transistor becomes thinner such that, for example, the driving voltage is 3 V or less, an integrated circuit comprising high-performance CMOS transistors and a flash EEPROM may be combined together, using the similar technique, without increasing the number of masks in use.

Turning to FIGS. 5A to 5J, a method for producing the non-volatile memory cell shown in FIG. 1 will be explained. It will be appreciated that the flash EEPROM can be formed with a number of masks smaller than in the prior-art technique and that redundant masks may not be used when combining the flash EEPROM with the high-performance CMOS transistors, which are among the features of the present invention.

First, a field oxide layer 10 is selectively formed on a portion of a surface of a p-type semiconductor substrate 9 by a customary device isolation method, such as LOCOS (Local Oxidation of Silicon) to define active regions 11, 12 and 13. The flash EEPROM forming region 11 and the n-channel transistor forming region 12 are then covered with a photoresist film (not shown) and phosphorus is doped into the p-channel transistor forming region 13 by ion implantation at hundreds of keV to 1 MeV to form a n-type well 14. Boron is doped by ion implantation at 15 to 30 keV for setting the surface concentration so that a desired p-channel transistor threshold voltage is obtained.

After peeling off the resist, the p-channel transistor forming region 13 is covered with a photoresist film 15 and boron is doped by ion implantation at hundreds of keV into the flash EEPROM forming region 11 and n-channel transistor forming region 12 for forming a p-type well 16. Boron is then doped by ion implantation at 15 to 30 keV and the surface concentration is set so that a desired threshold value for the n-channel transistor can subsequently be obtained.

After peeling off the photoresist film 15, the oxide layer on the substrate surface other than the field oxide layer is removed by etching, followed by oxidizing at 750° C. to 850° C. A first gate oxide layer 17 of approximately 70 to 200 Angstrom (7 to 20 nm) in thickness is thereby formed on the substrate surface except the field oxide layer, as shown in FIG. 5C. A first polysilicon layer 19 of 1500 to 2500 Angstrom (150 to 250 nm) in thickness is then formed by vapor deposition such as CVD on the entire surface. After phosphorous doping to render the conductivity type to the n-type, a photoresist 18 is formed on the flash EEPROM forming region 11. The polysilicon layer on the remaining portion is removed by well-known anisotropic dry etching to form a first polysilicon layer 19 only on the flash EEPROM forming region 11.

As shown in FIG. 5D, the photoresist film 18 is removed, and a silicon oxide layer 20, 50 to 150 Angstrom (5 to 15 nm) in thickness by thermal oxidation or vapor deposition, a silicon nitride layer 21, 50 to 150 Angstrom (5 to 15 nm) in thickness by vapor deposition and a silicon oxide layer 22, 20 to 80 Angstrom (2 to 8 nm) in thickness by thermal oxidation or vapor deposition, are sequentially formed on the entire surface. Subsequently, a photoresist 23 is formed to cover the flash EEPROM forming region. Using the photoresist as a mask, the oxide layer 22, the nitride layer 21 and the oxide layer 20 are etched sequentially for exposing the silicon substrate at the n-channel transistor forming region and the p-channel transistor forming region.

As shown in FIG. 5E, the photoresist film 23 is removed and a gate oxide layer 24, substantially 100 to 180 Angstrom (10 to 18 nm) in thickness is formed by thermal oxidation. At this time, the flash EEPROM forming region is protected by the nitride layer 21 and hence remains unaffected. A second polysilicon layer 25, 1000 to 2000 Angstrom (100 to 200 nm) in thickness is then formed by vapor deposition on the entire surface, and a metal silicide layer 26 such as tungsten silicide is formed by sputtering etc. to a thickness of 1000 to 2000 Angstrom (100 to 200 nm). A photoresist layer 27 is then formed as shown in FIG. 5E to cover the n-channel transistor forming region and the p-channel transistor forming region.

Then, as shown in FIG. 5F, the metal silicide layer 26, second polysilicon layer 25, upper layer oxide layer 22, nitride layer 21, under layer oxide layer 20 and the first polysilicon layer are sequentially removed by anisotropic etching, using these photoresists as masks, to form a dual gate electrode arrangement consisting of a floating gate 28 and a control gate 29. An oxide layer protective layer 30, 100 to 300 Angstrom (10 to 30 nm) in thickness, is then formed on the entire surface by vapor deposition or the like.

Then, as shown in FIG. 5G, arsenic is implanted at 30 to 70 keV and with a dose of about $5\times10^{14}$ $5\times10^{15}$ cm$^{-2}$, using as a mask the polysilicon layer and the metal silicide layer, left on the entire surface except the dual gate electrode arrangement and the flash EEPROM forming region, and an n-type diffusion layer regions 31 which are to become source and drain of a flash EEPROM cell are formed. Boron is then implanted into the substrate by ion implantation at an energy of 30 to 50 keV, at an angle of 30° to 60° relative to the substrate, with a dose of about $1\times10^{13}$~$1\times10^{15}$ cm$^{-2}$, while the substrate is rotated, thereby forming p-type diffusion layer regions 32 having a higher concentration than the substrate and wrapping the source and drain.

After removing the oxide layer protective layer 29, a photoresist 33 is formed to a pattern of forming a gate electrode at a portion of the n-channel transistor forming region 12 and the p-channel transistor forming region 13, to cover the flash EEPROM forming region 11, as shown in FIG. 5H. Using this as a mask, the metal silicide layer and the polysilicon layer are removed by etching to form a gate electrode 34 in the n-channel forming region and in the p-channel forming region, respectively.

Figure 5A:
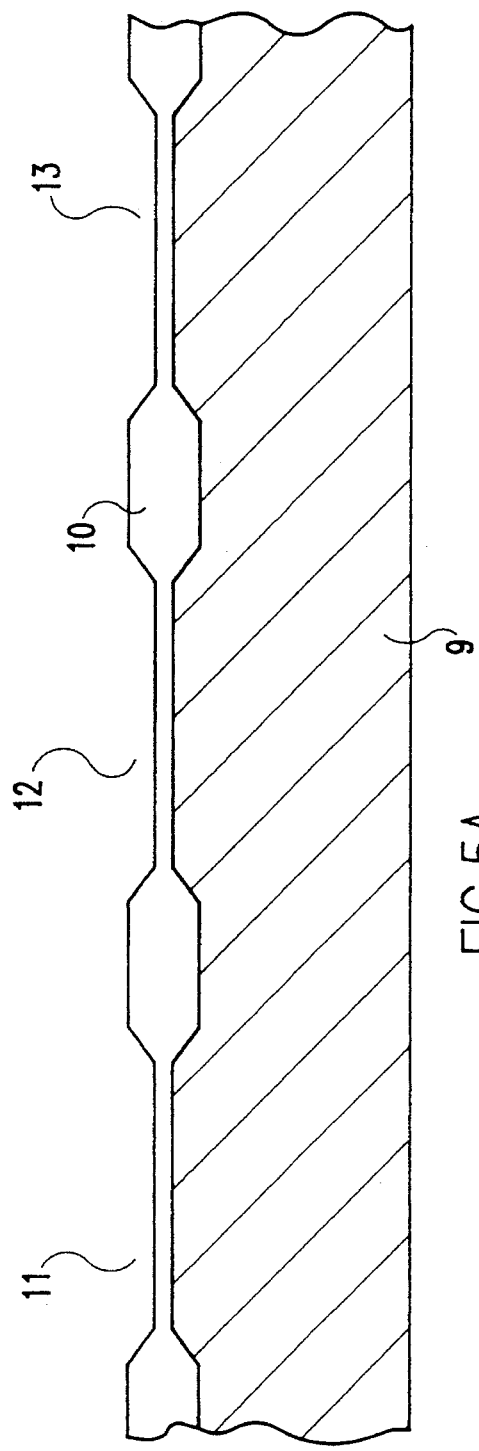
Figure 5B:
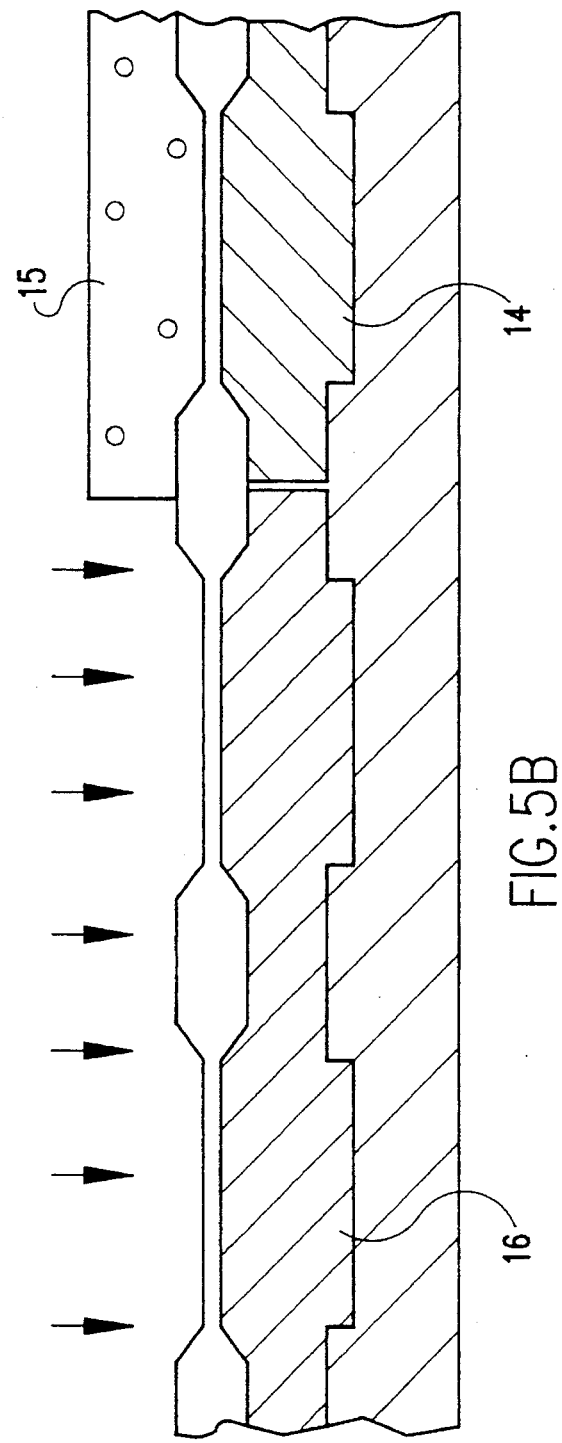
Figure 5I:
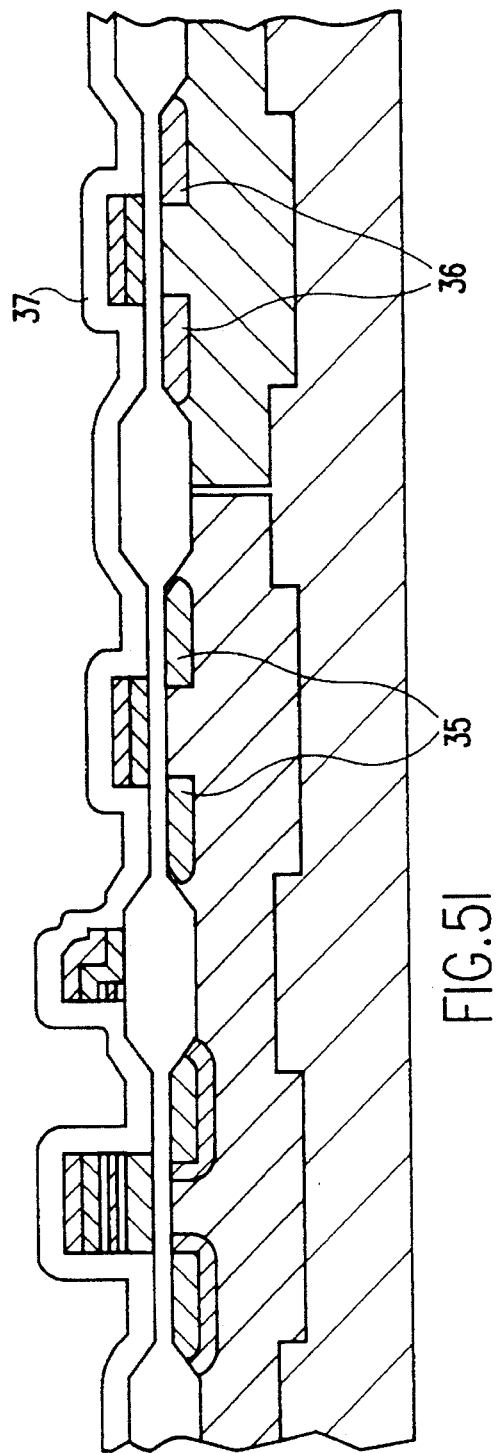

Then, as shown in FIG. 5I, phosphorous is doped by the well-known PR technique and ion implantation, at 40 to 100 keV and with a dose of about $1\times10^{13}$~$1\times10^{14}$ cm$^{-2}$, to form n$^-$ diffusion layer regions 35. Boron is then implanted at 10 keV~40 keV with a dose of about $1\times10^{13}$ $1\times10^{14}$ cm$^{-2}$, in p-channel transistor forming regions, for forming p diffusion layer regions 36. An oxide layer 37, 1000 to 2000 Angstrom (100 to 200 nm) in thickness, is then formed on the entire surface.

Figure 5J:
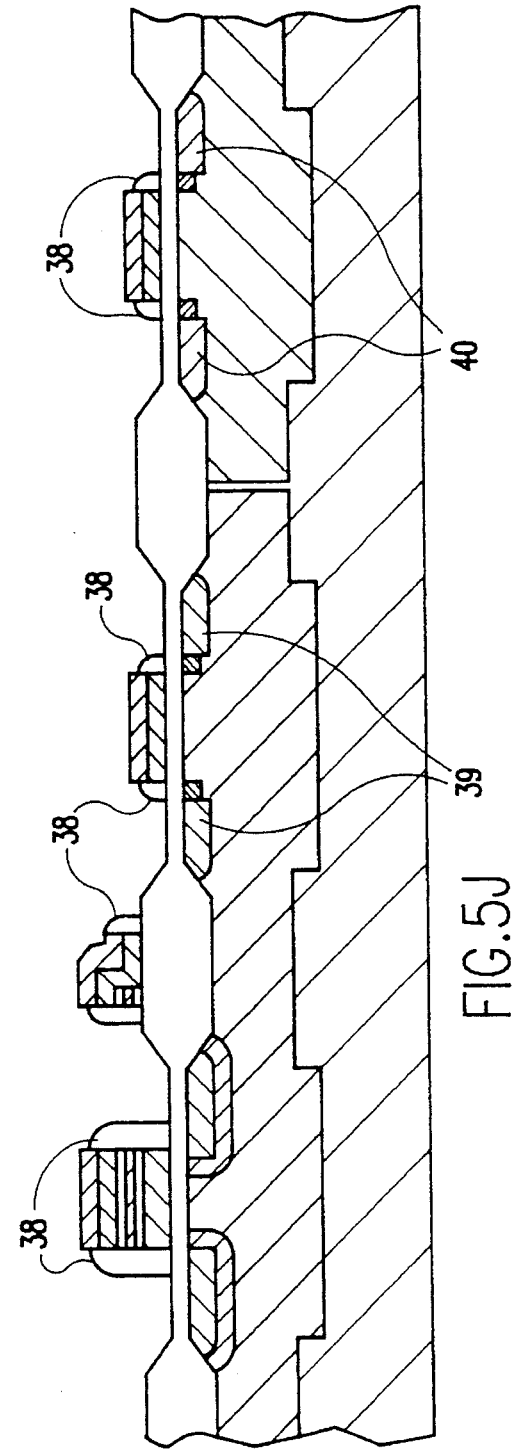

Then as shown in FIG. 5J, the oxide layer 37 is completely removed at a planar portion and left on the sidewall section of each gate electrode, by anisotropic etching for suitable period of time, to form sidewalls 38. Arsenic is implanted at 30 to 70 keV into the n-channel transistor forming regions with a dose of about $1\times10^{15}$ cm$^{-2}$ to $5\times10^{15}$ cm$^{-2}$ for forming n$^+$ diffusion layer regions 39. Boron fluoride is implanted at 30 to 70 keV into the p-channel forming regions with a dose of about $1\times10^{15}$ cm$^{-2}$ to $5\times10^{15}$ cm$^{-2}$ to form p$^+$ diffusion layer regions 40.

In the manner as described above, high-performance transistors having a lightly doped drain structure (LDD) and flash EEPROM memory cells according to the present invention are formed. Although not shown an inter-layer insulating layer, contact hole and interconnection are then formed by well-known methods to complete a memory device.

It will be seen from above that only three photomasking steps proper to the flash EEPROM cell (FIGS. 6C, 6D and 7E) are used. That is, the flash EEPROM according to the present invention may be formed on an IC chip comprising high-performance CMOS transistors by simply adding three mask steps.

Figure 6:
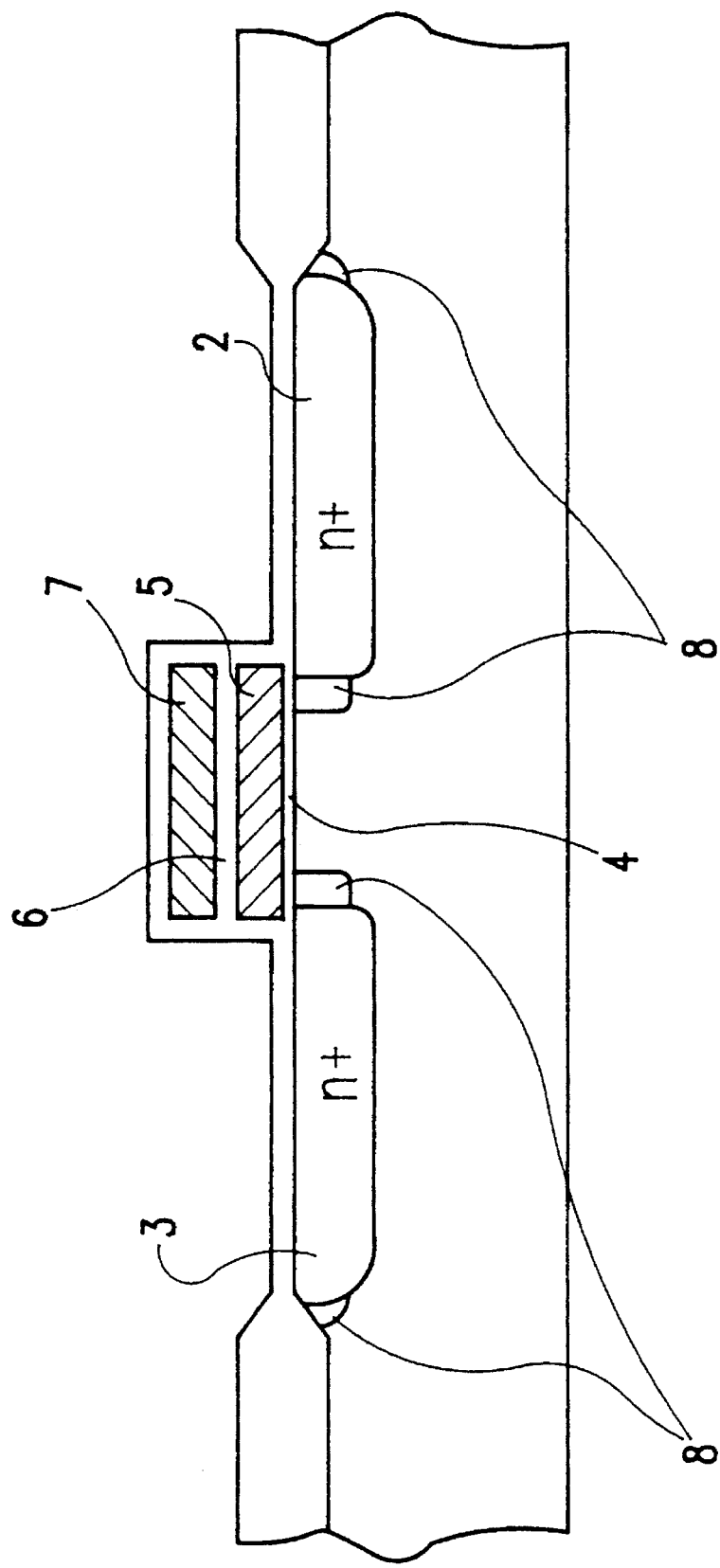
FIG. 6 is a cross-sectional view showing a non-volatile semiconductor device according to the second embodiment of the present invention.
Figure 7:
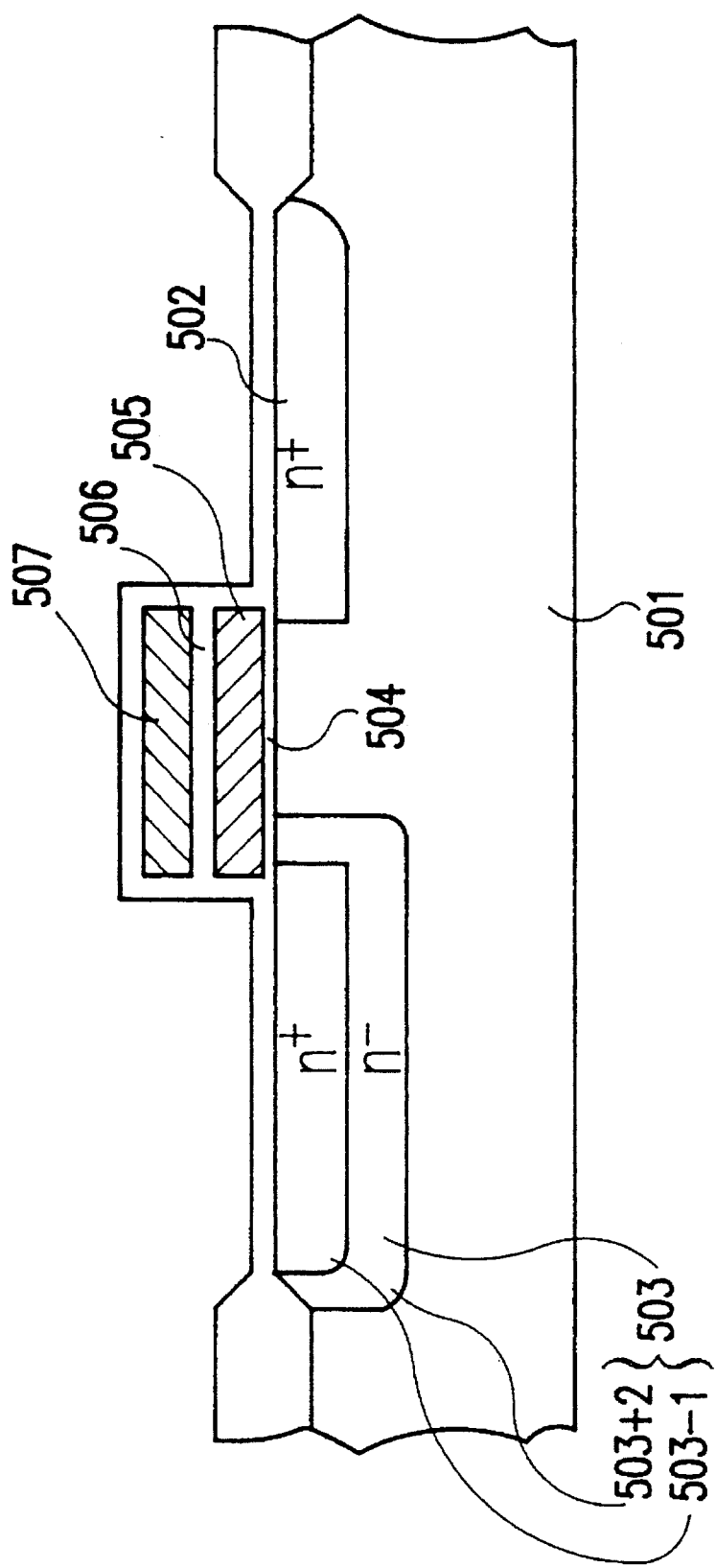
FIG. 7 is a cross-sectional view showing a conventional flash EEPROM.
Figure 8A:
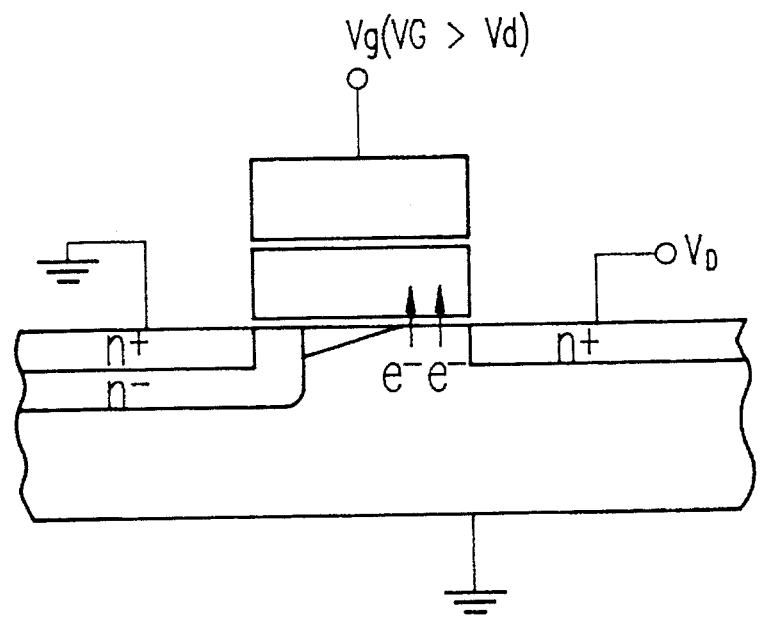
FIG. 8A is an explanatory view showing the conventional writing method for the flash EEPROM cell.
Figure 8B:
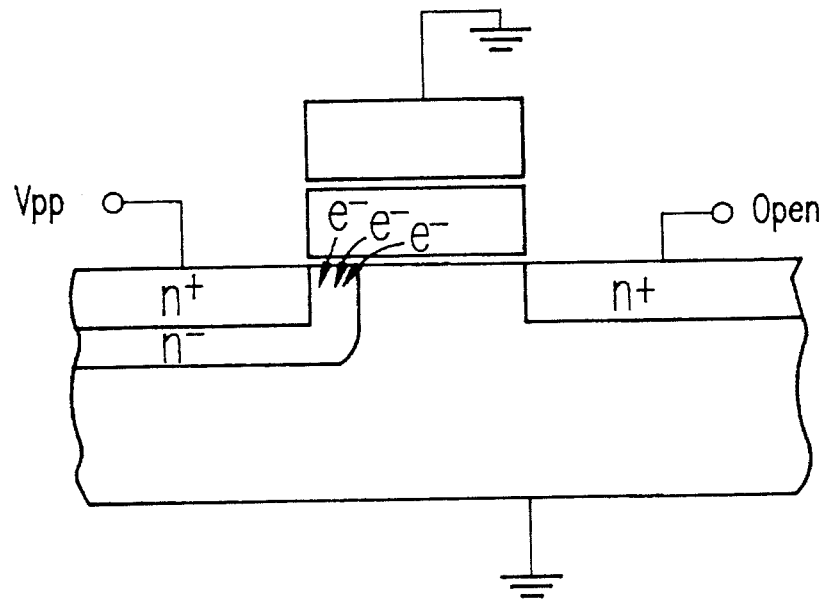
FIG. 8B is an explanatory view showing the conventional erasure method for the flash EEPROM cell.

FIG. 6 shows a cell structure of the flash EEPROM according to another embodiment of the present invention. The difference of the cell shown in FIG. 6 and that shown in FIG. 1 is that p-type regions 8 provided for lowering the write and erase voltage and having an impurity concentration higher than in the substrate does not wrap the source 3 and the drain 2 completely and are disposed adjacent thereto only at side wall portions. Specially, a pair of $p^+$-type regions 8 are disposed in the vicinity of side portions of each of the drain 2 and source 3. Such structure is obtained by suppressing the acceleration energy of the ion implantation for doping boron to a lower value at the step of FIG. 5G.

Since the parasitic capacity at the source and drain junctions is reduced in the present Example, data readout can be carried out more promptly.

Although the present invention has been described in connection with the above Examples, it should be understood that the present invention is not limited thereto and may comprise all modifications falling the true spirit and scope of the present invention.

What is claimed is:

1. A semiconductor memory device comprising:

a semiconductor substrate of a first conductivity type;

a plurality of memory cells, each of said memory cells including source and drain regions, of second conductive type opposite to said first conductivity type selectively formed in said semiconductor substrate to define a channel region therebetween, a first gate insulating layer disposed on said channel region, a first gate electrode disposed on said first gate insulating layer, a second gate insulating layer disposed on said first gate electrode, a second gate electrode disposed on said second gate insulating layer, first and second regions of said first conductivity type having an impurity concentration higher than that of said semiconductor substrate and selectively formed in said channel region in contact respectively with said source and drain regions;

first means for performing on a selected one of said memory cells a data programming operation of applying first and second positive voltages respectively to said second gate electrode and said drain region while applying a reference voltage to said source region and said semiconductor substrate to thereby inject carriers into said first gate electrode, and second means for performing on said selected one of said memory cells a data erasing operation of applying said reference voltage to said semiconductor substrate, applying a third positive voltage to said second gate electrode, bringing said drain region into an open state, and applying a fourth positive voltage to said source region so that an avalanche breakdown occurs between said source region and said first region and hot carriers generated by said avalanche breakdown are injected into said first gate electrode.

2. The device as claimed in claim 1, wherein said drain and source regions are symmetrical with each other.

3. The device as defined in claim 1, wherein the first positive voltage is 6 to 11 V and said second positive voltage is 3 to 7 V.

4. A non-volatile semiconductor memory device comprising:

a semiconductor substrate of a first conductivity type;

a plurality of memory cells each including source and drain regions of a second conductivity type, opposite to the first conductivity type, selectively formed in said semiconductor substrate to define a channel region therebetween, a first gate insulating layer disposed on said channel region;

a first gate electrode disposed on said first gate insulating layer, a second gate insulating layer disposed on said first gate electrode, a second gate electrode disposed on said second gate insulating layer, first and second regions of the first conductivity type having an impurity concentration higher than that of the semiconductor substrate and selectively formed in said channel region in contact respectively with said source and drain regions; and means for performing on a selected one of said memory cells a data erasing operation of applying a reference voltage to said semiconductor substrate, applying a first positive voltage to said second gate electrode, bringing said drain region into an open state, and applying a second positive voltage to said source region so that an avalanche breakdown occurs between said source region and said first region and hot carriers generated by said avalanche breakdown are injected into said first gate electrode.

5. The device as claimed in claim 4, wherein said drain and source regions are symmetrical with each other.

6. The data erasing method as defined in claim 4, wherein said first positive voltage is 0 to 4 V and said second positive voltage is 6 to 11 V.

7. A non-volatile semiconductor memory device comprising:

a semiconductor substrate of a first conductivity type and at least one memory cell, said memory cell including source and drain regions of a second conductivity type, opposite to the first conductivity type, selectively formed in said semiconductor substrate to define a channel region therebetween, a first insulating layer disposed on said channel region, a first gate electrode disposed on said first insulating layer, a second insulating layer disposed on said first gate electrode, a second gate electrode disposed on said second insulating layer, first and second regions of the first conductivity type having an impurity concentration higher than that of the channel region selectively formed on either side of said source region, and third and fourth regions of the first conductivity type having an impurity concentration higher than that of the channel region selectively formed on either side of said drain region.

* * * * *